(12) United States Patent
Ramm et al.

(10) Patent No.: US 12,120,813 B2
(45) Date of Patent: Oct. 15, 2024

(54) RADIO-FREQUENCY ARRANGEMENT HAVING TWO INTERCONNECTED RADIO-FREQUENCY COMPONENTS

(71) Applicant: Fraunhofer-Gesellschaft zur Foerderung der angewandten Forschung e.V., Munich (DE)

(72) Inventors: Peter Ramm, Munich (DE); Josef Weber, Munich (DE)

(73) Assignee: Fraunhofer-Gesellschaft zur Foerderung der angewandten Forschung e. V., Munich (DE)

( * ) Notice: Subject to any disclaimer, the term of this patent is extended or adjusted under 35 U.S.C. 154(b) by 473 days.

(21) Appl. No.: 17/212,736

(22) Filed: Mar. 25, 2021

(65) Prior Publication Data

US 2021/0307158 A1 Sep. 30, 2021

(30) Foreign Application Priority Data

Mar. 26, 2020 (DE) .......................... 102020203971.2

(51) Int. Cl.
*H05K 1/02* (2006.01)
*H01B 11/18* (2006.01)
(Continued)

(52) U.S. Cl.
CPC ........... *H05K 1/0243* (2013.01); *H01B 11/18* (2013.01); *H01L 23/66* (2013.01); *H01Q 1/2283* (2013.01); *H01Q 1/243* (2013.01)

(58) Field of Classification Search
CPC .................. H05K 1/0243; H05K 1/141; H05K 2201/10098; H05K 1/0221; H05K 1/0213; H05K 1/0237; H05K 1/0222; H01B 11/18; H01L 23/66; H01L 23/552; H01L 2223/6677; H01L 2224/08225; H01L 2224/08235; H01L 2924/15192; H01L 25/0655; H01L 25/105; H01L 23/5383; H01L 2223/6622; H01L 2223/6605;
(Continued)

(56) References Cited

U.S. PATENT DOCUMENTS 5,574,815 A * 11/1996 Kneeland ................ H01B 11/18
9,397,447 B2 * 7/2016 Kurachi ............. H01R 13/6592
(Continued)

FOREIGN PATENT DOCUMENTS

CN         107431064 A      12/2017
KR         20170118750 A    10/2017
(Continued)

OTHER PUBLICATIONS

SystemPlus Report © 2018 by System Plus Consulting | Qualcomm WiGig60 GHz Chipset Smartphone Edition, 2018.

*Primary Examiner* — Lana N Le
(74) *Attorney, Agent, or Firm* — Perkins Coie LLP; Michael A. Glenn (57) ABSTRACT

A radio-frequency arrangement is described. The radio-frequency arrangement has a first radio-frequency component, a second radio-frequency component and a wiring substrate having a coaxial radio-frequency line formed in the wiring substrate, wherein the first radio-frequency component and the second radio-frequency component are connected via the coaxial radio-frequency line.

12 Claims, 10 Drawing Sheets

(51) Int. Cl.
*H01L 23/66* (2006.01)
*H01Q 1/22* (2006.01)
*H01Q 1/24* (2006.01)

(58) Field of Classification Search
CPC ......... H01L 2223/6627; H01L 23/4985; H01L 2924/1903; H01Q 1/2283; H01Q 1/243; H01Q 1/2291; H01Q 13/203; H04B 1/50; H04B 13/00; H04B 5/0025; H04B 7/24; H01R 13/6592; H01R 12/515; H01R 24/38
See application file for complete search history.

(56) References Cited

U.S. PATENT DOCUMENTS

| | | | |
|---|---|---|---|
| 2002/0060366 A1 | 5/2002 | Kikuchi et al. | |
| 2003/0197249 A1* | 10/2003 | Doderer | H01L 23/552 257/662 |
| 2006/0145350 A1* | 7/2006 | Gross | H01L 23/5383 257/E23.152 |
| 2009/0101408 A1* | 4/2009 | Koyama | H01R 9/0524 174/72 A |
| 2013/0050050 A1* | 2/2013 | Zhu | H01Q 1/2283 343/866 |
| 2014/0325150 A1* | 10/2014 | Hashimoto | H01L 23/49 257/659 |
| 2015/0097633 A1 | 4/2015 | Devries et al. | |
| 2016/0248451 A1 | 8/2016 | Weissman et al. | |
| 2016/0276729 A1 | 9/2016 | Dang et al. | |
| 2017/0154859 A1* | 6/2017 | Yap | H01Q 1/2291 |
| 2018/0145459 A1* | 5/2018 | Burris | H01R 24/40 |
| 2019/0273320 A1 | 9/2019 | Kim et al. | |
| 2019/0373739 A1 | 12/2019 | Morita et al. | |
| 2020/0118951 A1* | 4/2020 | Aleksov | H01L 25/0655 |
| 2020/0211986 A1* | 7/2020 | Curtis | H05K 1/0221 |
| 2021/0167015 A1* | 6/2021 | Qian | H01L 23/552 |
| 2023/0187712 A1* | 6/2023 | Meyer-Teruel | H04B 7/24 |

FOREIGN PATENT DOCUMENTS

| | | | |
|---|---|---|---|
| TW | 517337 B | 1/2003 | |
| TW | 202005495 A | 1/2020 | |
| WO | WO-2018236336 A1 * | 12/2018 | ......... H01L 21/4857 |

* cited by examiner

222 — Providing at least two electrical radio-frequency components each having at least one terminal pad for radio-frequency signals and each having at least one terminal pad for at least one external conductor for radio-frequency shielding

224 — Providing a wiring substrate

226 — Producing a shielded radio-frequency transmission line structure including at least one internal conductor, at least one external conductor, insulation around the at least one internal conductor, and insulation around the at least one external conductor in the wiring substrate

228 — Producing at least one electrically conducting connection between the at least one terminal pad of the first radio-frequency component and the at least one internal conductor of the shielded radio-frequency transmission line structure in the wiring substrate

230 — Producing at least one electrically conducting connection between the at least one terminal pad of the second radio-frequency component and the at least one external conductor of the shielded radio-frequency transmission line structure in the wiring substrate

Fig. 10

RADIO-FREQUENCY ARRANGEMENT HAVING TWO INTERCONNECTED RADIO-FREQUENCY COMPONENTS

CROSS-REFERENCE TO RELATED APPLICATION

This application claims priority from German Application No. 102020203971.2, which was filed on Mar. 26, 2020, and is incorporated herein by reference in its entirety.

BACKGROUND OF THE INVENTION

Embodiments of the present invention relate to a radio-frequency arrangement and, in particular, to a radio-frequency arrangement comprising two interconnected radio-frequency components. Further embodiments relate to a method for manufacturing a radio-frequency arrangement.

Figure 1:
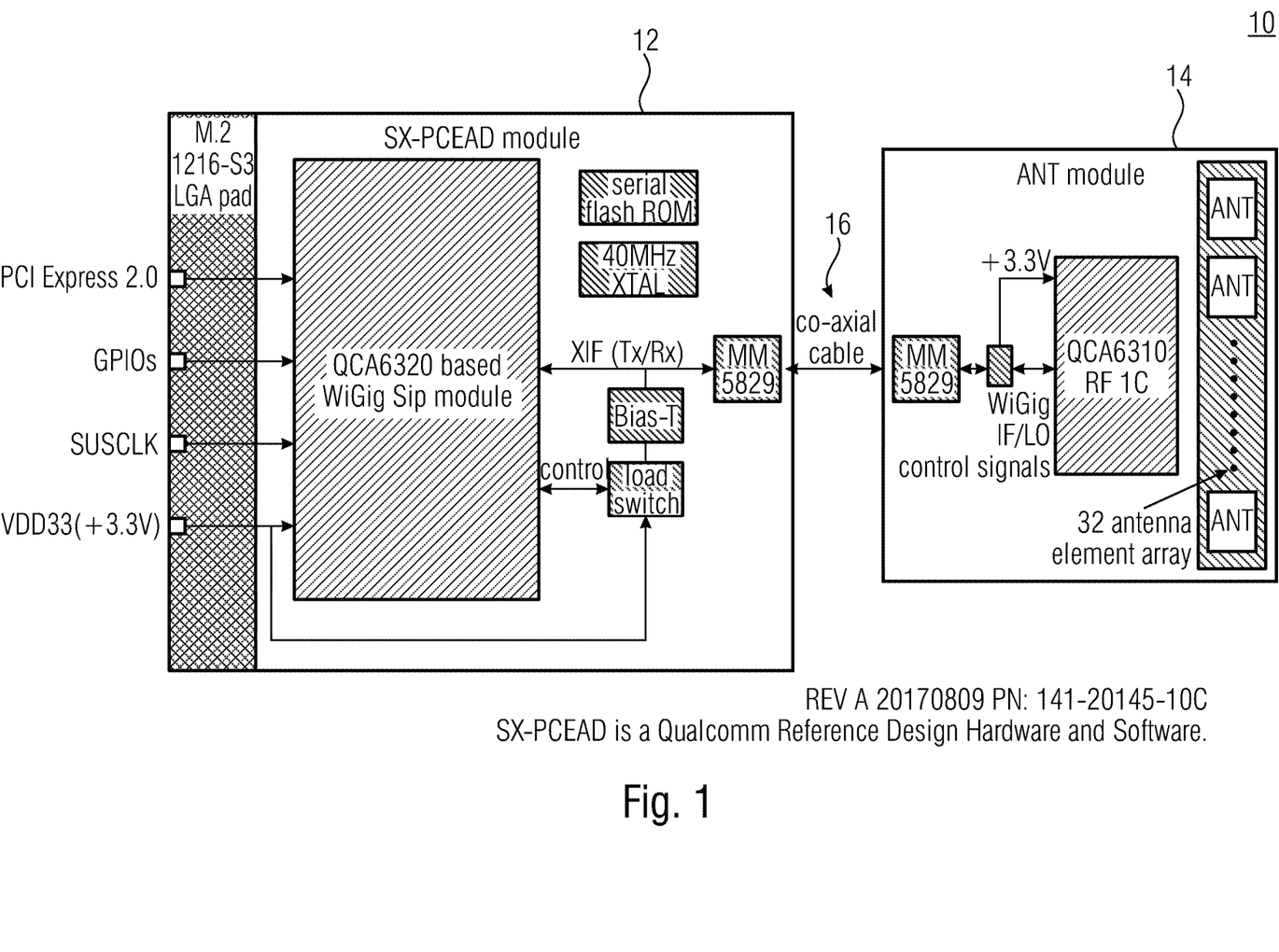
FIG. 1 is a schematic block circuit diagram of a conventional radio-frequency arrangement comprising two interconnected radio-frequency components (baseband board and antenna board) in accordance with [1]

FIG. 1 shows a schematic block circuit diagram of a conventional radio-frequency arrangement comprising two interconnected radio-frequency components (baseband board and antenna board) 12 and 14 in accordance with [1].

Figure 2:
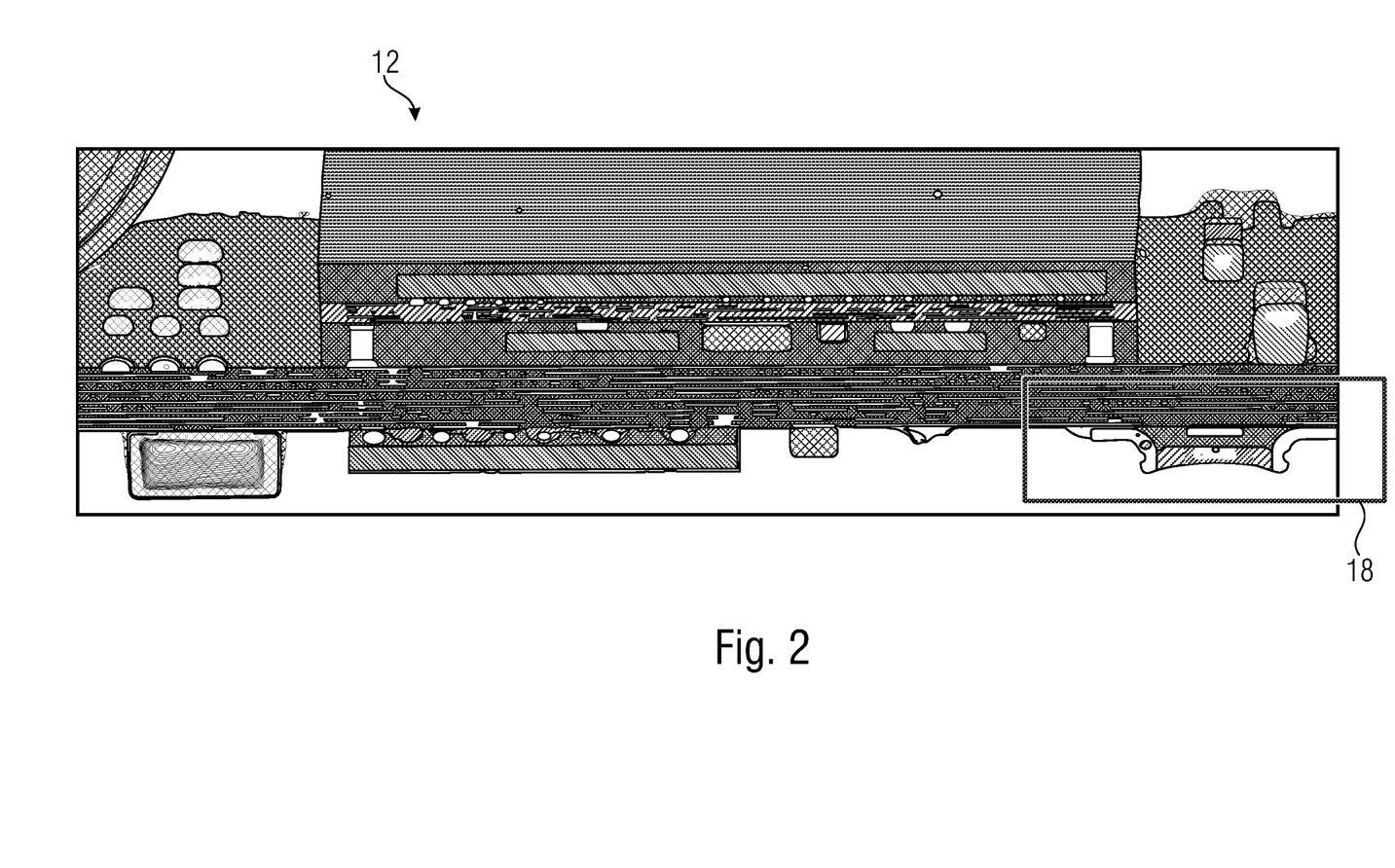
FIG. 2 shows a schematic cross-sectional view of a baseband board (baseband system-on-package) having a coaxial terminal socket in accordance with [1]
Figure 3:
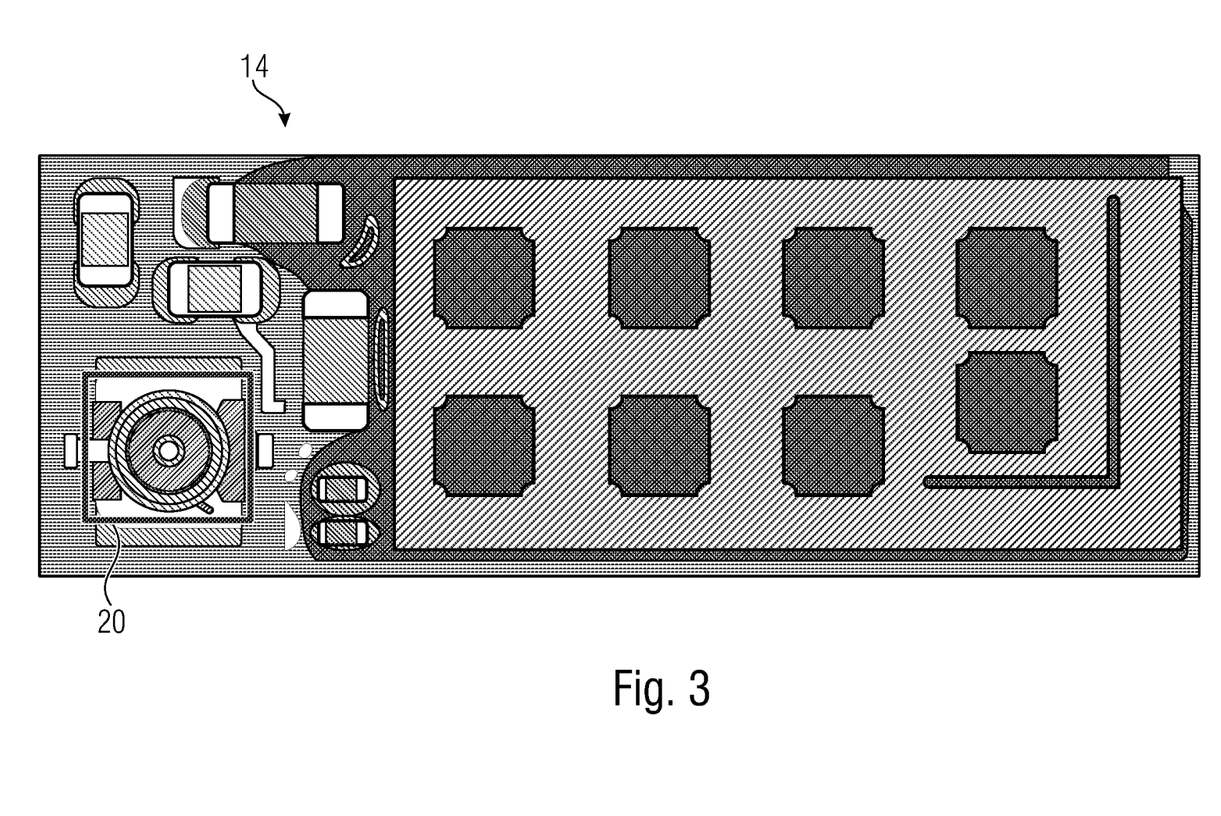
FIG. 3 shows a schematic view of an antenna board having a coaxial terminal socket in accordance with [1]

As can be recognized in FIG. 1, conventionally, when setting up systems of mobile communication, the electrical connection between a radio-frequency component 12, like a baseband board, for example, like a baseband processor, together with further circuits on a PCB (Printed Circuit Board), and at least one further electronic component 14, like an antenna board (typically antennas, RFICs etc.), for example, is realized via coaxial cables 16 and coaxial terminals as a radio-frequency connection (typically able to process 60 GHz). FIGS. 2 and 3 here show coaxial terminals 18 and 20 of a baseband board 12, implemented as a baseband system-on-package, and an antenna board 14 in accordance with [1].

However, in production, such a conventional radio-frequency arrangement entails comparatively high manufacturing costs. The costs for the coaxial elements used—sockets and cables—and the terminals or connections to the respective metallization planes of the electronic components are considerable when compared to the conventionally used modern highly integrated so-called systems-in-package technologies for manufacturing the electronic components to be connected.

Thus, the object underlying the present invention is providing a concept which allows a cheaper connection of radio-frequency components.

SUMMARY

In accordance with an embodiment, a radio-frequency arrangement may have: a first-frequency component, a second radio-frequency component, and a wiring substrate having a coaxial radio-frequency line formed in the wiring substrate, wherein the first radio-frequency component and the second radio-frequency component are connected via the coaxial radio-frequency line.

Another embodiment may have a participant of a mobile communication system, wherein the participant has an inventive radio-frequency arrangement as mentioned above.

In accordance with another embodiment, a method for manufacturing a radio-frequency arrangement may have the steps of: providing a first radio-frequency component, providing a second radio-frequency component, providing a wiring substrate having a coaxial radio-frequency line formed in the wiring substrate, and connecting the first radio-frequency component and the second radio-frequency component via the wiring substrate.

Embodiments provide a radio-frequency arrangement. The radio-frequency arrangement comprises a first radio-frequency component, a second radio-frequency component, and a wiring substrate having a coaxial radio-frequency line formed in the wiring substrate, the first radio-frequency component and the second radio-frequency component being connected via the coaxial radio-frequency line.

In embodiments, the first radio-frequency component is a baseband board.

In embodiments, the second radio-frequency component is an antenna board.

In embodiments, the coaxial radio-frequency line comprises at least one internal conductor and at least one external conductor for radio-frequency shielding the at least one internal conductor, the at least one external conductor surrounding the at least one internal conductor, the at least one external conductor and the at least one internal conductor being insulated from each other.

In embodiments, at least one radio-frequency signal terminal of the first radio-frequency component is connected to at least one radio-frequency signal terminal of the second radio-frequency component via the at least one internal conductor, at least one radio-frequency shielding terminal of the first radio-frequency component being connected to at least one radio-frequency shielding terminal of the second radio-frequency component via the at least one external conductor.

In embodiments, the at least one internal conductor passes laterally in the wiring substrate so that the at least one internal conductor is arranged in parallel to a surface of the wiring substrate adjacent to the first radio-frequency component and the second radio-frequency component, wherein the at least one internal conductor is guided to the surface of the wiring substrate via at least two mutually spaced connective conductors passing vertically in the wiring substrate, wherein a first connective conductor of the at least two connective conductors is connected to the at least one radio-frequency signal terminal of the first radio-frequency component, wherein a second connective conductor of the at least two connective conductors is connected to the at least one radio-frequency signal terminal of the second radio-frequency component.

In embodiments, the at least one external conductor surrounding the at least one internal conductor is opened in regions of the at least two connective conductors.

Further embodiments provide a mobile radio communication device comprising a radio-frequency arrangement described herein/above.

Further embodiments provide a method for manufacturing a radio-frequency arrangement. The method comprises providing a first radio-frequency component. Additionally, the method comprises providing a second radio-frequency component. Additionally, the method comprises providing a wiring substrate having a coaxial radio-frequency line formed in the wiring substrate. In addition, the method comprises connecting the first radio-frequency component and the second radio-frequency component via the wiring substrate.

In embodiments, the first radio-frequency component is a baseband board.

In embodiments, the second radio-frequency component is an antenna board.

In embodiments, the coaxial radio-frequency line comprises at least one internal conductor and at least one external conductor for radio-frequency shielding the at least one internal conductor, the at least one external conductor surrounding the at least one internal conductor, the at least one external conductor and the at least one internal conductor being insulated from one another.

In embodiments, when connecting the first radio-frequency component and the second radio-frequency component via the wiring substrate, at least one radio-frequency signal terminal of the first radio-frequency component is connected to at least one radio-frequency signal terminal of the second radio-frequency component via the at least one internal conductor, wherein, when connecting the first radio-frequency component and the second radio-frequency component via the wiring substrate, at least one radio-frequency shielding terminal of the first radio-frequency component is connected to at least one radio-frequency shielding terminal of the second radio-frequency component via the at least one external conductor.

In embodiments, the at least one internal conductor passes laterally in the wiring substrate so that the at least one internal conductor is arranged in parallel to a surface of the wiring substrate adjacent to the first radio-frequency component and the second radio-frequency component, wherein the at least one internal conductor is guided to the surface of the wiring substrate via at least two mutually spaced connective conductors passing vertically in the wiring substrate, wherein, when connecting the first radio-frequency component and the second radio-frequency component via the wiring substrate, a first connective conductor of the at least two connective conductors is connected to the at least one radio-frequency signal terminal of the first radio-frequency component, wherein, when connecting the first radio-frequency component and the second radio-frequency component via the wiring substrate, a second connective conductor of the at least two connective conductors is connected to the at least one radio-frequency signal terminal of the second radio-frequency component.

In embodiments, providing the wiring substrate comprises providing a substrate and forming the coaxial radio-frequency line in the substrate.

Further embodiments provide an apparatus. The apparatus comprises at least two electrical radio-frequency components each comprising at least one terminal pad for radio-frequency signals and each comprising at least one terminal pad for at least one external conductor for radio-frequency shielding. Additionally, the apparatus comprises a wiring substrate, the wiring substrate comprising a shielded radio-frequency transmission line structure which comprises at least one internal conductor, at least one external conductor, an insulation around the at least one internal conductor, and an insulation around the at least one external conductor. Additionally, the apparatus comprises at least one electrically conducting connection between the at least one terminal pad of the first radio-frequency component and the at least one internal conductor of the shielded radio-frequency transmission line structure in the wiring substrate. Additionally, the apparatus comprises at least one electrically conducting connection between the at least one terminal pad of the second radio-frequency component and the at least one external conductor of the shielded radio-frequency transmission line structure in the wiring substrate.

Further embodiments provide a method for connecting at least two electrical radio-frequency components. The method comprises a step of providing at least two electrical radio-frequency components each comprising at least one terminal pad for radio-frequency signals and each comprising at least one terminal pad for at least one external conductor for radio-frequency shielding. Additionally, the method comprises a step of providing a wiring substrate. Additionally, the method comprises a step of producing a shielded radio-frequency transmission line structure including at least one internal conductor, at least one external conductor, an insulation around the at least one internal conductor, and an insulation around the at least one external conductor in the wiring substrate. Additionally, the method comprises a step of producing at least one electrically conducting connection between the at least one terminal pad of the first radio-frequency component and the at least one internal conductor of the shielded radio-frequency transmission line structure in the wiring substrate. Additionally, the method comprises a step of producing at least one electrically conducting connection between the at least one terminal pad of the second radio-frequency component and the at least one external conductor of the shielded radio-frequency transmission line structure in the wiring substrate.

Embodiments of the present invention provide a radio-frequency electrical connection of components by means of a wiring substrate having an integrated transmission line.

Embodiments of the present invention provide a method for manufacturing electronic radio-frequency systems and, in particular, highly integrated so-called systems-in-package for being used in mobile communication.

Embodiments of the present invention realize the electrical connection of at least two electrical radio-frequency components via a specific wiring substrate having an integrated radio-frequency transmission line structure and suitable terminal connections to the metallization planes of the radio-frequency components.

BRIEF DESCRIPTION OF THE DRAWINGS

Embodiments of the present invention will be described below in greater detail referring to the appended drawings, in which.

DETAILED DESCRIPTION OF THE INVENTION

In the following description of embodiments of the present invention, equal elements or elements of equal effect are provided with equal reference numerals in the figures so that their description is mutually interchangeable.

Figure 4:
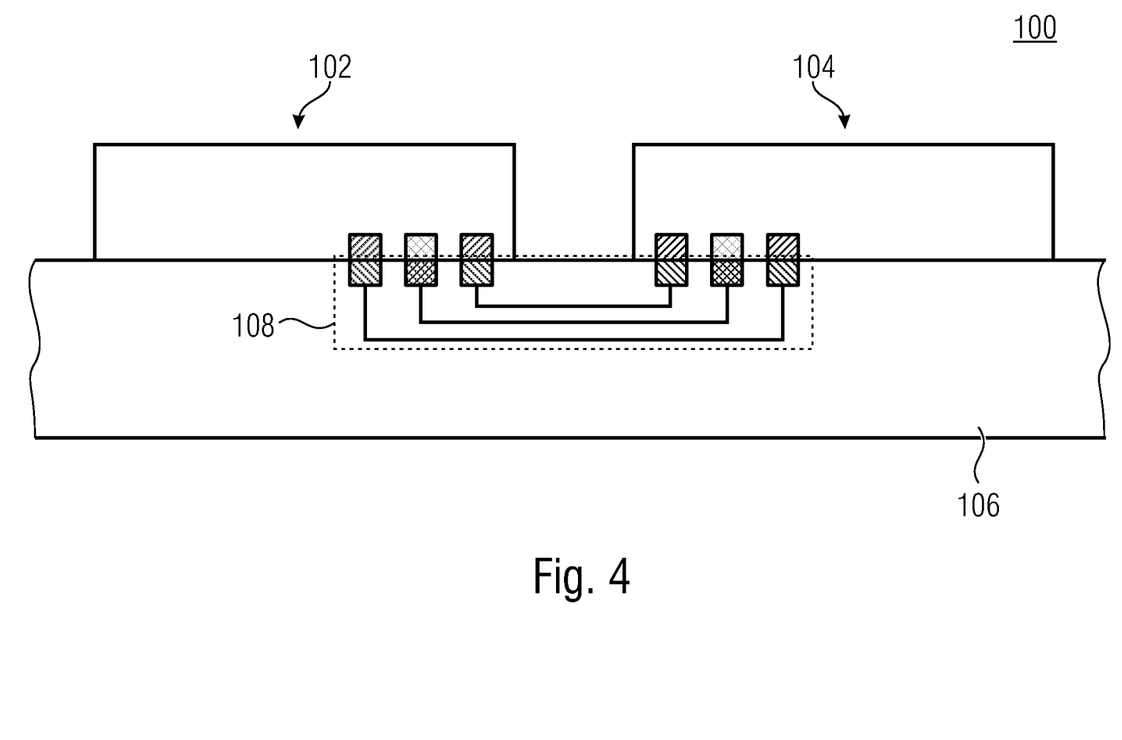
FIG. 4 shows a schematic cross-sectional view of a radio-frequency arrangement in accordance with an embodiment of the present invention.

FIG. 4 shows a schematic cross-sectional view of a radio-frequency arrangement 100 in accordance with an embodiment of the present invention. The radio-frequency arrangement 100 comprises a first radio-frequency component 102, a second radio-frequency component 104 and a wiring substrate 106 having a coaxial radio-frequency line 108 formed in the wiring substrate 106, the first radio-frequency component 102 and the second radio-frequency component 104 being connected via the coaxial radio-frequency line 108.

Figure 5:
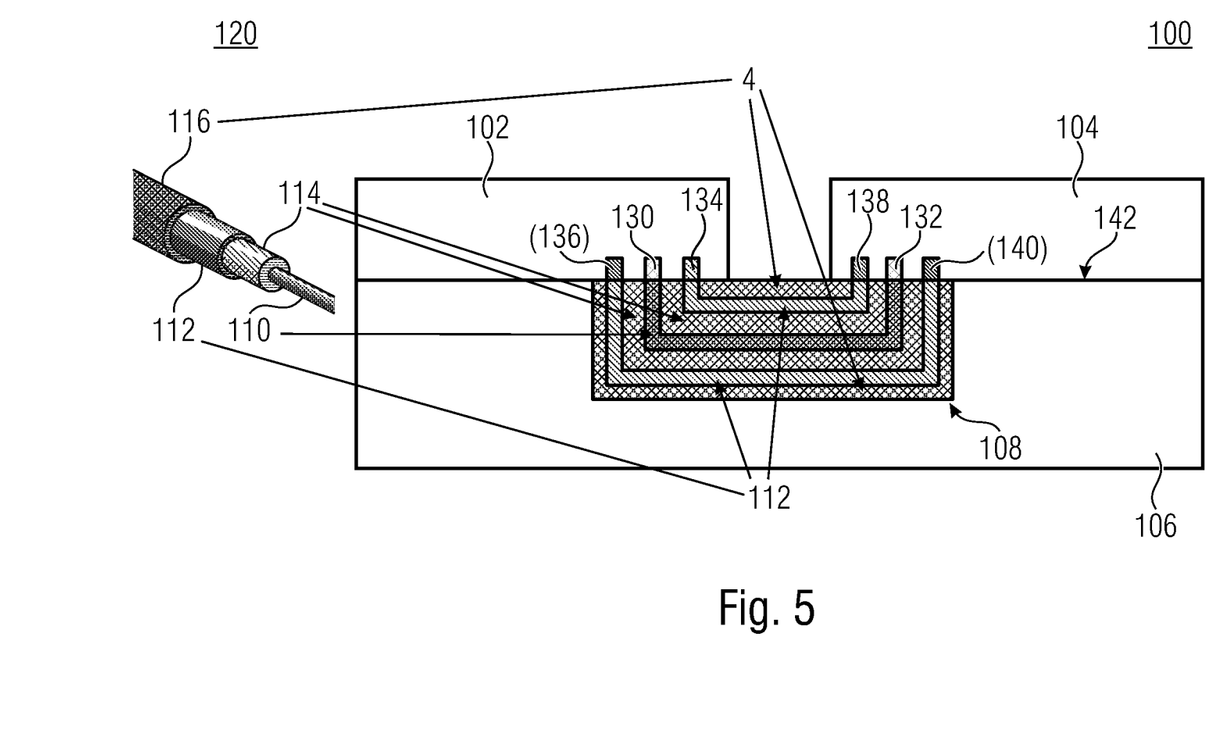
FIG. 5 shows a schematic cross-sectional view of a radio-frequency arrangement in accordance with another embodiment of the present invention.

FIG. 5 shows a schematic cross-sectional view of a radio-frequency arrangement 100 in accordance with another embodiment of the present invention. In other words, FIG. 5 shows a way of realizing the coaxial radio-frequency line 108 formed in the wiring substrate 106. Like in the case of a conventional coaxial cable 60, which is exemplarily shown for comparative purposes in FIG. 4, in embodiments, the coaxial radio-frequency line 108 can comprise at least one internal conductor 110 and at least one external conductor 112 for shielding (like radio-frequency shielding) the at least one internal conductor 110, the at least one external conductor 112 surrounding the at least one internal conductor 110, and the at least one external conductor 112 and the at least one internal conductor 112 being insulated from one another, for example by means of an insulation 114, like a dielectric (like $SiO_2$), for example. Additionally, the at least one external conductor 112 can also be insulated, for example by means of an insulation 116, like a dielectric (like $SiO_2$), for example.

In embodiments, the at least one internal conductor 110 can be manufactured from an electrically conductive material, like copper, silver or gold, for example.

In embodiments, the at least one external conductor 112 can be manufactured from an electrically conductive material, like copper, silver or gold, for example. Advantageously, the at least one external conductor 112 can be at a reference potential, like ground, for example.

In embodiments, at least one radio-frequency signal terminal 130 of the first radio-frequency component 102 can be connected to at least one radio-frequency signal terminal 132 of the second radio-frequency component 104 via the at least one internal conductor 110, wherein at least one radio-frequency shielding terminal 143 (and optionally 136) of the first radio-frequency component 102 is connected to at least one radio-frequency shielding terminal 138 (and optionally 140) of the second radio-frequency component 104 via the at least one external conductor 112.

In embodiments, the at least one internal conductor 110 can be arranged in parallel to a surface 142 of the wiring substrate 106 adjacent to the first radio-frequency component 102 and/or the second radio-frequency component 104, wherein the at least one internal conductor 110 is guided to the surface 142 of the wiring substrate 106 via at least two mutually spaced connective conductors passing vertically in the wiring substrate 106, wherein a first connective conductor of the at least two connective conductors is connected to the at least one radio-frequency signal terminal 130 of the first radio-frequency component 102, and wherein a second connective conductor of the at least two connective conductors is connected to the at least one radio-frequency signal terminal 132 of the second radio-frequency component 104.

In embodiments, the first radio-frequency component 102 can be a baseband board.

In embodiments, the second radio-frequency component 104 can be an antenna board.

In other words, FIG. 5 shows an example of a radio-frequency electrical connection of two components 102 and 104 by means of a wiring substrate 106 having an integrated transmission line 108 (when compared to a conventional coaxial cable 120 having an internal conductor (core), insulation and radio-frequency shielding.

In other words, FIG. 5 shows a schematic view of an apparatus 100 in accordance with an embodiment of the present invention. The apparatus 100 comprises at least two electrical radio-frequency components 102 and 104 each comprising at least one terminal pad 130 and 132 for radio-frequency signals and each comprising at least one terminal pad 134 (and optionally 136) and 138 (and optionally 140) for at least one external conductor 112 for radio-frequency shielding. Additionally, the apparatus 100 comprises a wiring substrate 106, the wiring substrate 106 comprising a shielded radio-frequency transmission line structure 108 which comprises at least one internal conductor 110, at least one external conductor 112, an insulation 114 around the at least one internal conductor 110, and an insulation 116 around the at least one external conductor 112. Additionally, the apparatus 100 comprises at least one electrically conducting connection between the at least one terminal pad 130 of the first radio-frequency component 102 and the at least one internal conductor 110 of the shielded radio-frequency transmission line structure 108 in the wiring substrate 106. Additionally, the apparatus 100 comprises at least one electrically conducting connection between the at least one terminal pad 132 of the second radio-frequency component 104 and the at least one external conductor 112 of the shielded radio-frequency transmission line structure 108 in the wiring substrate 106.

Figure 6:
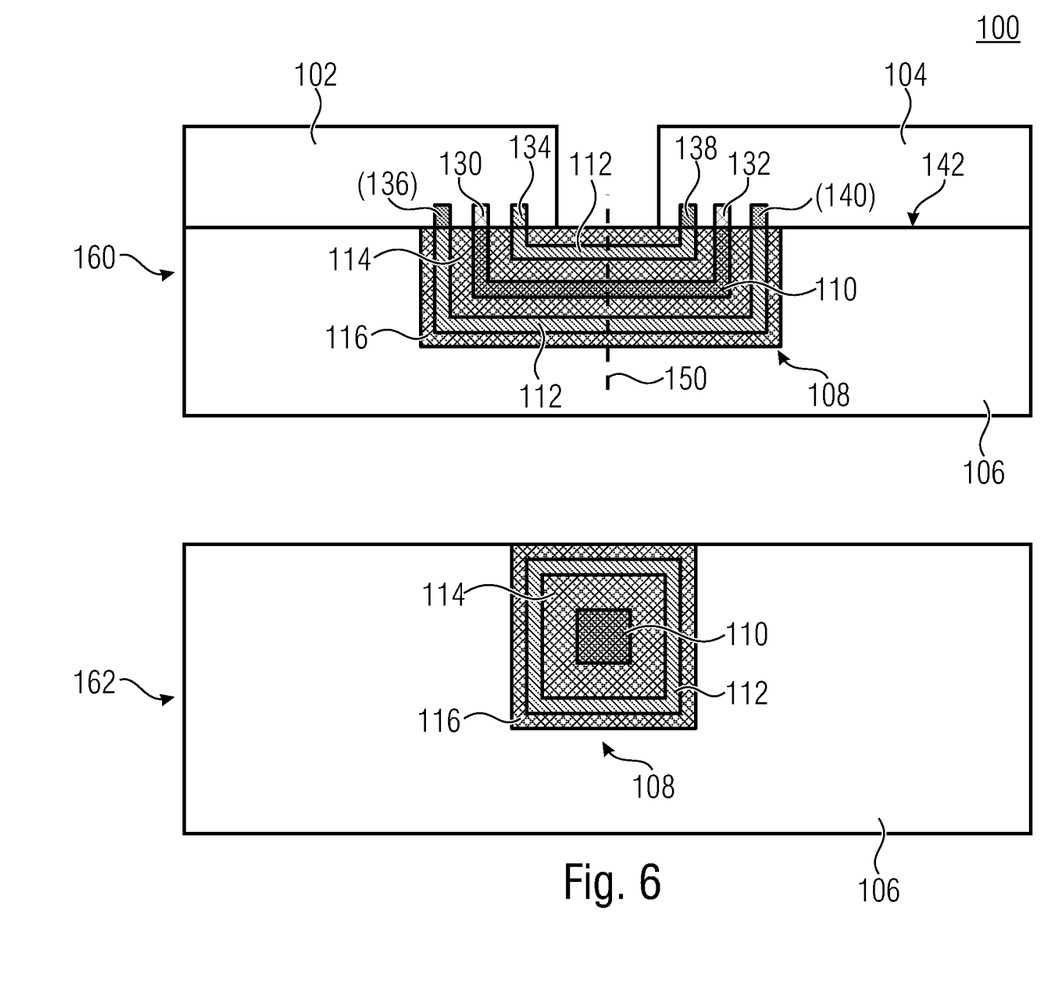
FIG. 6 shows a schematic cross-sectional view of the radio-frequency arrangement of FIG. 5, and a schematic cross-sectional view of the wiring substrate along a sectional plane which passes perpendicularly through the coaxial radio-frequency line in the region between the two radio-frequency components, in accordance with an embodiment.

FIG. 6 shows a schematic cross-sectional view 160 of the radio-frequency arrangement 100 from FIG. 5, and a schematic cross-sectional view 162 of the wiring substrate 106 along a sectional plane 150 which passes perpendicularly through the coaxial radio-frequency line 108 in the region between the two radio-frequency components 102 and 104, in accordance with an embodiment. In other words, FIG. 6 shows an embodiment of a way of realizing the coaxial radio-frequency line 108.

As can be recognized in FIG. 6 in the cross-sectional view 162, the coaxial radio-frequency line 108 can comprise an internal conductor 110 and an external conductor 112, the external conductor 112 surrounding the internal conductor 110, the external conductor 112 and the internal conductor 112 being insulated each other, for example by means of an insulation 114, and the external conductor 112 being surrounded also by an insulation 116.

Figure 7:
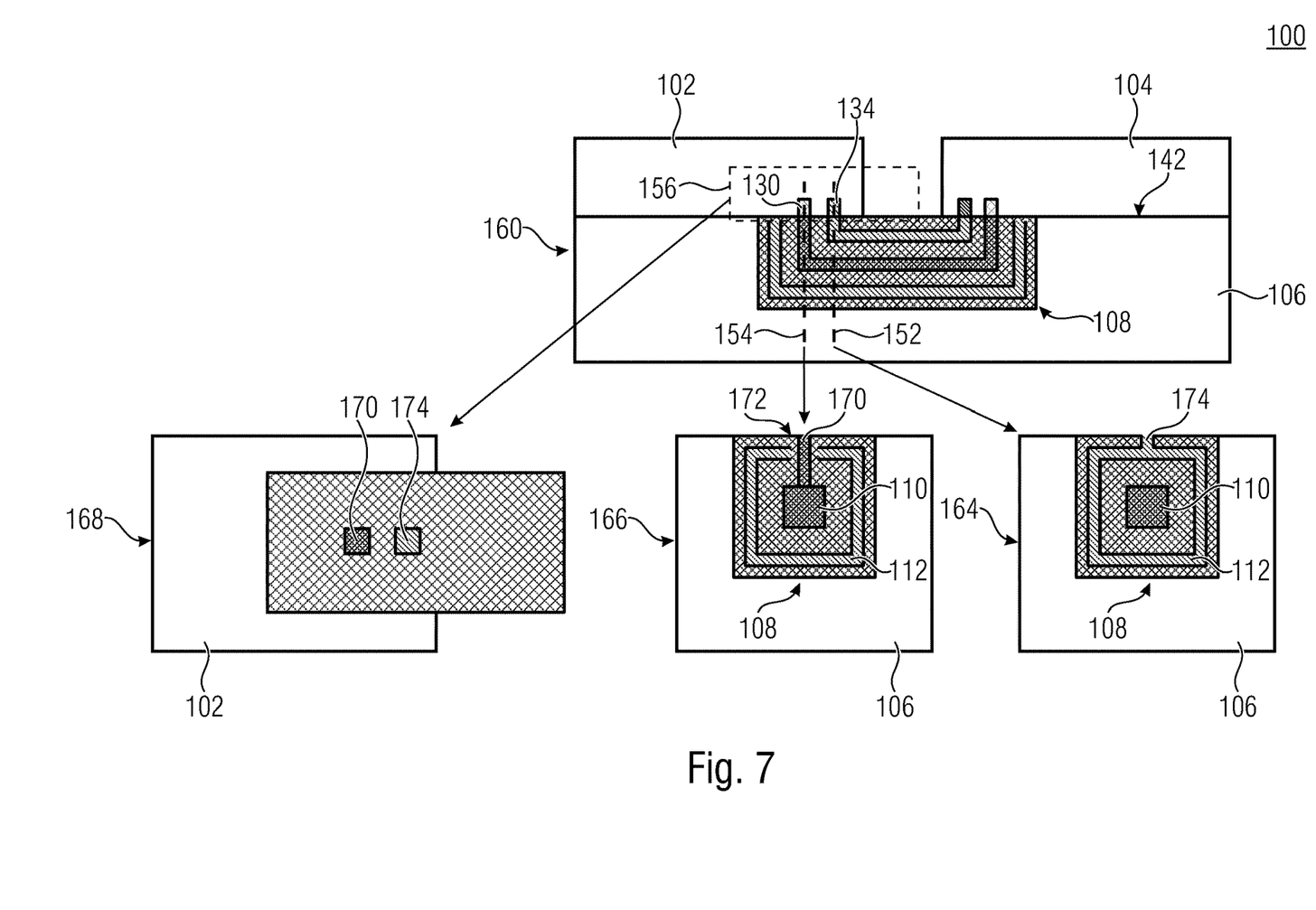
FIG. 7 shows a schematic cross-sectional view of the radio-frequency arrangement of FIG. 5, a schematic cross-sectional view of the wiring substrate along the sectional plane which passes perpendicularly through the coaxial radio-frequency line in the region of the radio-frequency shielding terminal of the first radio-frequency component, a schematic cross-sectional view of the wiring substrate along a sectional plane which passes perpendicularly through the coaxial radio-frequency line in the region of the radio-frequency signal terminal of the first radio-frequency component, and a top view of the wiring substrate in the region of the first radio-frequency component.

FIG. 7 shows a schematic cross-sectional view 160 of the radio-frequency arrangement 100 of FIG. 5, a schematic cross-sectional view 164 of the wiring substrate 106 along a sectional plane 152 which passes perpendicularly through the coaxial radio-frequency line 108 in the region of the radio-frequency shielding terminal 134 of the first radio-frequency component 102, a schematic cross-sectional view 166 of the wiring substrate 106 along a sectional view 154 which passes perpendicularly through the coaxial radio-frequency line 108 in the region of the radio-frequency signal terminal 130 of the first radio-frequency component 102, and a top view of the wiring substrate in the region 156 of the first radio-frequency component 102. In other words, FIG. 7 shows an embodiment of a way of realizing the terminals.

As can be recognized in FIG. 7, in embodiments, the internal conductor 110 of the coaxial radio-frequency line 108 can be guided to a surface 142 of the wiring substrate 106 (cf. top view 168) for connecting to the radio-frequency signal terminal 130 of the first radio-frequency component 102 via a connective conductor 170 (see cross-sectional view 166) passing vertically in the wiring substrate 106. In embodiments, the at least one external conductor 112 of the coaxial radio-frequency line 108 surrounding the internal conductor 110 can be opened in the region 172 of the vertically passing connective conductor 170.

As can also be recognized in FIG. 7, in embodiments, the external conductor 112 of the coaxial radio-frequency line 108 can be guided to a surface 142 of the wiring substrate 106 (see top view 168) for connecting to the shielding terminal 134 of the first radio-frequency component 102 via a connective conductor 174 (see cross-sectional 164) passing vertically in the wiring substrate 106.

Figure 8:
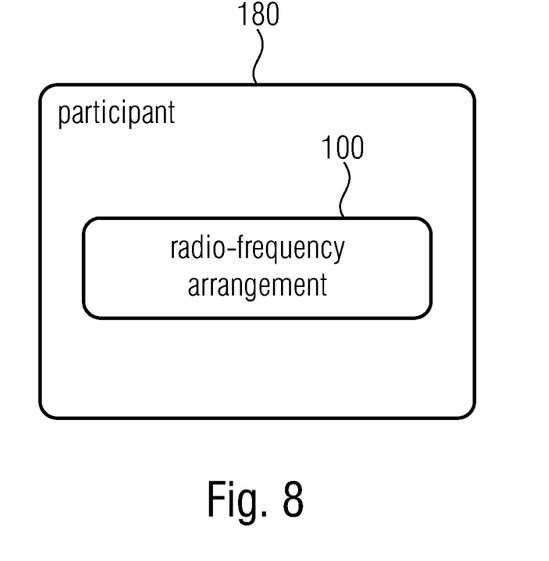
FIG. 8 shows a schematic block circuit diagram of a participant of a mobile radio communication system having a radio-frequency arrangement in accordance with an embodiment of the present invention.

FIG. 8 shows a schematic block circuit diagram of a participant 180 of a mobile radio communication system (like 3G, LTE or 5G) having a radio-frequency arrangement 100 in accordance with an embodiment of the present invention.

The participant 180 can, for example, be a mobile terminal device (user equipment) or an IoT (Internet of Things) node.

Figure 9:
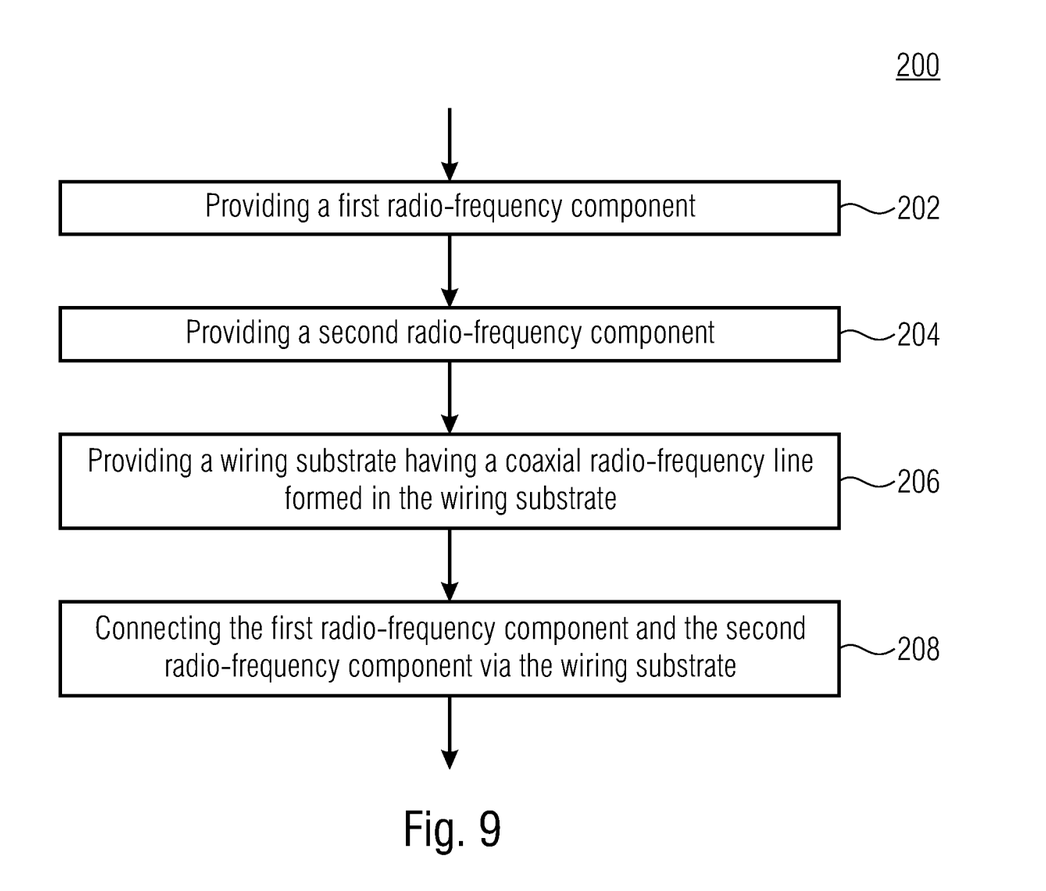
FIG. 9 shows a flow chart of a method for manufacturing a radio-frequency arrangement in accordance with an embodiment of the present invention.

FIG. 9 shows a flowchart of a method 200 for manufacturing a radio-frequency arrangement 100 in accordance with an embodiment of the present invention. The method 200 comprises a step 202 of providing a first radio-frequency component. Additionally, the method comprises a step 204 of providing a second radio-frequency component. Additionally, the method comprises a step 206 of providing a wiring substrate having a coaxial radio-frequency line formed in the wiring substrate. Additionally, the method comprises a step 208 of connecting the first radio-frequency component and the second radio-frequency component via the wiring substrate.

Figure 10:
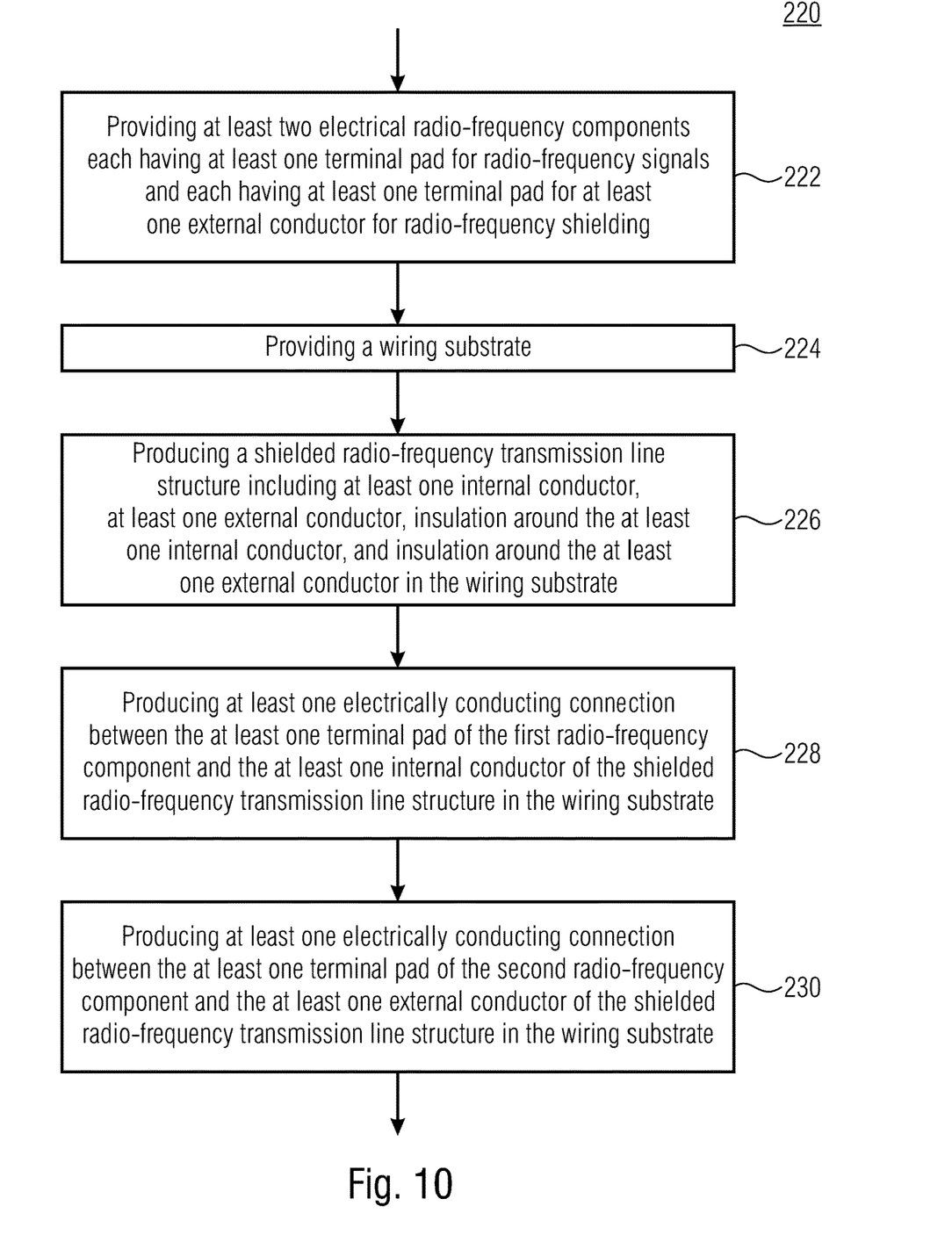
FIG. 10 shows a flow chart of a method for connecting at least two electrical radio-frequency components in accordance with an embodiment.

FIG. 10 shows a flow chart of a method 220 for connecting at least two electrical radio-frequency components in accordance with an embodiment. The method 220 comprises a step of providing at least two electrical radio-frequency components each comprising at least one terminal pad for radio-frequency signals and each comprising at least one terminal pad for at least one external conductor for radio-frequency shielding. Additionally, the method 220 comprises a step 224 of providing a wiring substrate. Additionally, the method 220 comprises a step 226 of producing a shielded radio-frequency transmission line structure including at least one internal conductor, at least one external conductor, an insulation around the at least one internal conductor, and an insulation around the at least one external conductor in the wiring substrate. Additionally, the method 220 comprises a step 228 of producing at least one electrically conducting connection between the at least one terminal pad of the first radio-frequency component and the at least one internal conductor of the shielded radio-frequency transmission line structure in the wiring substrate. Additionally, the method 220 comprises a step 230 of producing at least one electrically conducting connection between the at least one terminal pad of the second radio-frequency component and the at least one external conductor of the shielded radio-frequency transmission line structure in the wiring substrate.

Embodiments described herein serve as a replacement of conventional coaxial connections between the components, like the baseband board and the antenna board in mobile communication, for example.

Embodiments of the present invention overcome the disadvantages of a connection via a conventional coaxial cable, as described in the introduction to the description.

Embodiments of the present invention allow a highly productive mass production of multi-functional radio-frequency modules by means of populating technologies.

Although some aspects have been described in connection with an apparatus, it is to be understood that these aspects also represent a description of the corresponding method so that a block or element of an apparatus is to be understood also to be a corresponding method step or feature of a method step. In analogy, aspects described in connection with or as a method step also represent a description of a corresponding block or detail or feature of a corresponding apparatus. Some or all of the method steps can be executed by a hardware apparatus (or using a hardware apparatus), like a microprocessor, a programmable computer or an electronic circuit, for example. In some embodiments, some or several of the most important method steps can be executed by such an apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

LIST OF REFERENCES

[1] SystemPlus Report ©2018 by System Plus Consulting | Qualcomm WiGig60 GHz Chipset Smartphone Edition

The invention claimed is:

1. A radio-frequency arrangement comprising:
a first radio-frequency component,
a second radio-frequency component, and
a wiring substrate comprising a coaxial radio-frequency line formed in the wiring substrate,
  wherein the first radio-frequency component and the second radio-frequency component are connected via the coaxial radio-frequency line,
  wherein the coaxial radio-frequency line (108) comprises at least one internal conductor (110) and at least one external conductor (112) for radio-frequency shielding the at least one internal conductor (110), wherein the at least one external conductor (112) completely surrounds the at least one internal conductor (110), wherein the at least one external conductor (112) and the at least one internal conductor (110) are insulated from one another, wherein at least one radio-frequency signal terminal of the first radio-frequency component is connected to at least one radio-frequency signal terminal of the second radio-frequency component via the at least one internal conductor, wherein at least one radio-frequency shielding terminal of the first radio-frequency component is connected to at least one radio-frequency shielding terminal of the second radio-frequency component via the at least one external conductor.

2. The radio-frequency arrangement in accordance with claim 1,
wherein the first radio-frequency component is a baseband board.

3. The radio-frequency arrangement in accordance with claim 1,
wherein the second radio-frequency component is an antenna board.

4. The radio-frequency arrangement in accordance with claim 1,
wherein the at least one internal conductor passes laterally in the wiring substrate so that the at least one internal conductor is arranged in parallel to a surface of the wiring substrate adjacent to the first radio-frequency component and/or the second radio-frequency component,
wherein the at least one internal conductor is guided to the surface of the wiring substrate via at least two mutually spaced connective conductors passing vertically in the wiring substrate,
wherein a first connective conductor of the at least two connective conductors is connected to the at least one radio-frequency signal terminal of the first radio-frequency component,
wherein a second connective conductor of the at least two connective conductors is connected to the at least one radio-frequency signal terminal of the second radio-frequency component.

5. The radio-frequency arrangement in accordance with claim 4,
wherein the at least one external conductor surrounding the at least one internal conductor is opened in regions of the at least two connective conductors.

6. A participant of a mobile communication system,
wherein the participant comprises a radio-frequency arrangement in accordance with claim 1.

7. The radio-frequency arrangement (100) in accordance with claim 1,
wherein the at least one external conductor (112) and the at least one internal conductor 112 are insulated from one another by means of silicon dioxide, $SiO_2$.

8. A method for manufacturing a radio-frequency arrangement, the method comprising:
providing a first radio-frequency component,
providing a second radio-frequency component,
providing a wiring substrate comprising a coaxial radio-frequency line formed in the wiring substrate, and
connecting the first radio-frequency component and the second radio-frequency component via the wiring substrate, wherein the coaxial radio-frequency line (108) comprises at least one internal conductor (110) and at least one external conductor (112) for radio-frequency shielding the at least one internal conductor (110), wherein the at least one external conductor (112) completely surrounds the at least one internal conductor (110), wherein the at least one external conductor (112) and the at least one internal conductor (110) are insulated from one another, wherein, when connecting the first radio-frequency component and the second radio-frequency component via the wiring substrate, at least one radio-frequency signal terminal of the first radio-frequency component is connected to at least one radio-frequency signal terminal of the second radio-frequency component via the at least one internal conductor, wherein, when connecting the first radio-frequency component and the second radio-frequency component via the wiring substrate, at least one radio-frequency shielding terminal of the first radio-frequency component is connected to at least one radio-frequency shielding terminal of the second radio-frequency component via the at least one external conductor.

9. The method in accordance with claim 8,
wherein the first radio-frequency component is a baseband board.

10. The method in accordance with claim 8,
wherein the second radio-frequency component is an antenna board.

11. The method in accordance with claim 8,
wherein the at least one internal conductor passes laterally in the wiring substrate so that the at least one internal conductor is arranged in parallel to a surface of the wiring substrate adjacent to the first radio-frequency component and/or the second radio-frequency component,
wherein the at least one internal conductor is guided to the surface of the wiring substrate via at least two mutually spaced connective conductors passing vertically in the wiring substrate,
wherein, when connecting the first radio-frequency component and the second radio-frequency component via the wiring substrate, a first connective conductor of the at least two connective conductors is connected to the at least one radio-frequency signal terminal of the first radio-frequency component,
wherein, when connecting the first radio-frequency component and the second radio-frequency component via the wiring substrate, a second connective conductor of the at least two connective conductors is connected to the at least one radio-frequency signal terminal of the second radio-frequency component.

12. The method in accordance with claim 8,
wherein providing the wiring substrate comprises:
providing a substrate,
forming the coaxial radio-frequency line in the substrate.

* * * * *